(12) United States Patent
Tseng et al.

(10) Patent No.: US 7,435,663 B2
(45) Date of Patent: Oct. 14, 2008

(54) METHODS FOR DICING A RELEASED CMOS-MEMS MULTI-PROJECT WAFER

(75) Inventors: Sheng-Hsiang Tseng, Hsin-Chu (TW); Fu-Yuan Xiao, Lu-Chou (TW); Ying-Zong Juang, Tainan (TW); Chin-Fong Chiu, Hsin-Chu (TW)

(73) Assignee: National Applied Research Laboratories National Chip International Center, Hsinchu (TW)

( * ) Notice: Subject to any disclaimer, the term of this patent is extended or adjusted under 35 U.S.C. 154(b) by 154 days.

(21) Appl. No.: 11/270,491

(22) Filed: Nov. 10, 2005

(65) Prior Publication Data

US 2006/0105545 A1 May 18, 2006

Related U.S. Application Data

(60) Provisional application No. 60/626,925, filed on Nov. 12, 2004.

(51) Int. Cl.
*H01L 21/00* (2006.01)
*H01L 21/44* (2006.01)

(52) U.S. Cl. .................. 438/460; 438/464; 438/792; 257/E21.255; 257/E21.256

(58) Field of Classification Search ............... 438/460; 134/1.3; 257/E21.256, E21.255
See application file for complete search history.

(56) References Cited

U.S. PATENT DOCUMENTS

| | | | | |
|---|---|---|---|---|
| 5,932,027 A * | 8/1999 | Mohindra et al. | ............. | 134/21 |
| 5,985,363 A * | 11/1999 | Shiau et al. | ................. | 427/240 |
| 6,151,430 A * | 11/2000 | Traver et al. | ................. | 385/14 |
| 6,440,218 B1* | 8/2002 | Sanada et al. | ............... | 118/697 |
| 6,551,400 B2* | 4/2003 | Hasbe et al. | .................. | 118/52 |
| 7,071,032 B2* | 7/2006 | Hsu et al. | .................... | 438/113 |
| 2002/0187433 A1* | 12/2002 | Ocola | ......................... | 430/322 |
| 2003/0045131 A1* | 3/2003 | Verbeke et al. | ............. | 438/795 |
| 2004/0029362 A1* | 2/2004 | Liu | ............................ | 438/460 |
| 2006/0165887 A1* | 7/2006 | Lee et al. | .................... | 427/240 |

* cited by examiner

*Primary Examiner*—Michael S Lebentritt
(74) *Attorney, Agent, or Firm*—Rosenberg, Klein & Lee

(57) ABSTRACT

Simple but practical methods to dice a CMOS-MEMS multi-project wafer are proposed. On this wafer, micromachined microstructures have been fabricated and released. In a method, a photoresist is spun on the full wafer surface, and this photoresist is thick enough to cover all cavities and structures on the wafer, such that the photoresist will protect the released structures free from the chipping, vibrations, and damages in the diamond blade dicing process. In another method, a laser dicing system is utilized to scribe the multi-project wafer placed on a platform, and by precisely controlling the platform moving-track, the dicing path can be programmed to any required shape and region, even it is not straight. In addition, the wafer backside is mounted on a blue-tape at the beginning to enhance the process reliability.

9 Claims, 10 Drawing Sheets

METHODS FOR DICING A RELEASED CMOS-MEMS MULTI-PROJECT WAFER

REFERENCE TO RELATED APPLICATIONS

This Patent Application is based upon Provisional Patent Application Ser. No. 60/626,925 filed on 12 Nov. 2004.

FIELD OF THE INVENTION

The present invention is generally related to wafer dicing processes and, more particularly, to methods for dicing a released CMOS-MEMS multi-project wafer.

BACKGROUND OF THE INVENTION

There are many advantages to leverage the complementary metal-oxide-semiconductor (CMOS) process for microelectromechanical systems (MEMS). For passive radio frequency (RF) components, such as high-quality (high-Q) inductors using bulk micromachining to remove the silicon substrate enable to eliminate the substrate losses, parasitic effects and coupling interference, so that their self-resonant frequency and quality factor can be improved. Other micromachining devices, such as high-Q mechanical resonators, filters, RF low loss switches, tunable capacitors, and some representative components have also been designed and verified through CMOS-MEMS compatible processes. MEMS technologies offer the potential to build a plenty of miniaturized components on a same chip, and have various applications in that with high performance, multi-function, and also low cost. However, unlike the standard integrated circuit (IC) package where the circuits have rigid passivation, micromachined structures are restricted to the movable architecture and the absence of protective layer. For this reason, one of the main challenges in fabricating CMOS-MEMS multi-project wafers is to protect the released microstructures during dicing the wafers. Conventional dicing machine uses water to cool the rotating diamond blade during the dicing process, and thus damages the released micromachined devices. Other existing solutions such as hermetic-bonded glass/silicon cap, however, requires very smooth wafer surface, high bonding temperature, and high applied voltage. The above processes may damage the CMOS circuits that have been fabricated on the wafers. Besides, the complex procedure of those methods will also result in a low yield.

For an example, FIG. 1 shows a cross-sectional view of a CMOS-MEMS microstructure available from a multi-project wafer that was fabricated by TSMC 0.35 μm 2-poly 4-metal (2P4M) CMOS process and National Chip Implementation Center (CIC) CMOS post micromachining process. On a silicon substrate 10, a mechanical microstructure 12 is made of the metallization and dielectric layers of CMOS interconnections. The anisotropic/isotropic dry etching is employed to release the mechanical microstructure 12. Unlike the other portions on this wafer protected by nitride passivation layer 14 and metal layer 16, the released MEMS structure 12 is in contact with the environment, and easily affected by the post processing. Therefore, the safety and capability of the micromachined structure 12 tend to be critical.

Accordingly, there is a demand to prevent the MEMS structures on a wafer from destructive dicing process.

SUMMARY OF THE INVENTION

Instead of involving the complex dicing steps, two plain methods are proposed according to the present invention.

In a method, a thick photoresist is spun on the full wafer surface to cover all cavities and structures on the wafer, then the wafer is diced with the photoresist to protect the released structures free from the chipping, vibrations, and damages in a diamond blade dicing process, and the residual photoresist on the die is removed thereafter.

In another method, a UV-laser is utilized to scribe a wafer placed on a platform, the laser does not directly cut off MEMS dice from the wafer at a time but scribe to a deep depth, and then the wafer is broken along the dicing track from the back with the deeply precutting grooves at the front side.

Because of their simplicity and high reliability, these two methods are expected to benefit the CMOS-MEMS technologies. In addition, they may be useful in the packaging of system-on-chip (SoC).

BRIEF DESCRIPTION OF THE DRAWINGS

These and other objects, features and advantages of the present invention will become apparent to those skilled in the art upon consideration of the following description of the preferred embodiments of the present invention taken in conjunction with the accompanying drawings, in which.

DETAILED DESCRIPTION OF THE INVENTION

Two reliable methods are proposed to overcome the destruction and damage issues.

<Photoresist Method>

Figure 1:
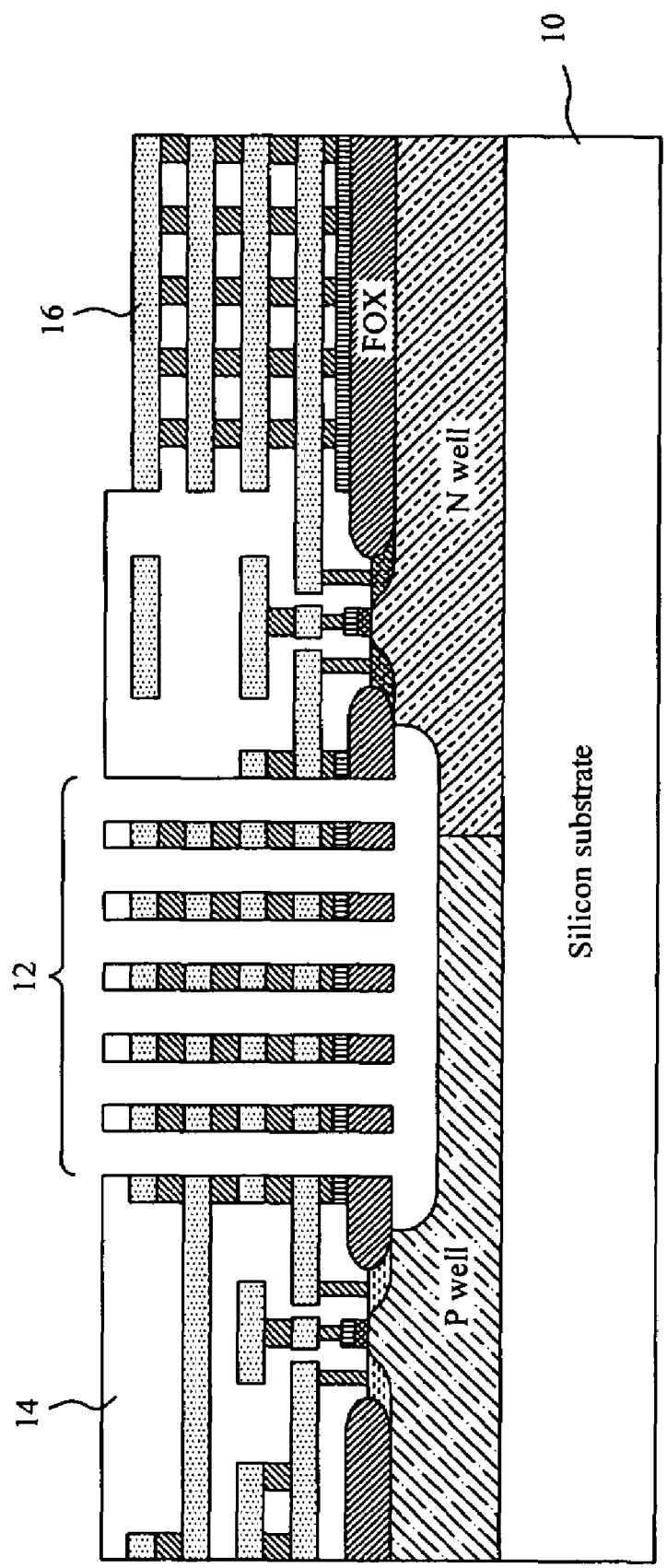
FIG. 1 shows a cross-sectional view of a CMOS-MEMS microstructure available from a multi-project wafer.
Figure 2:
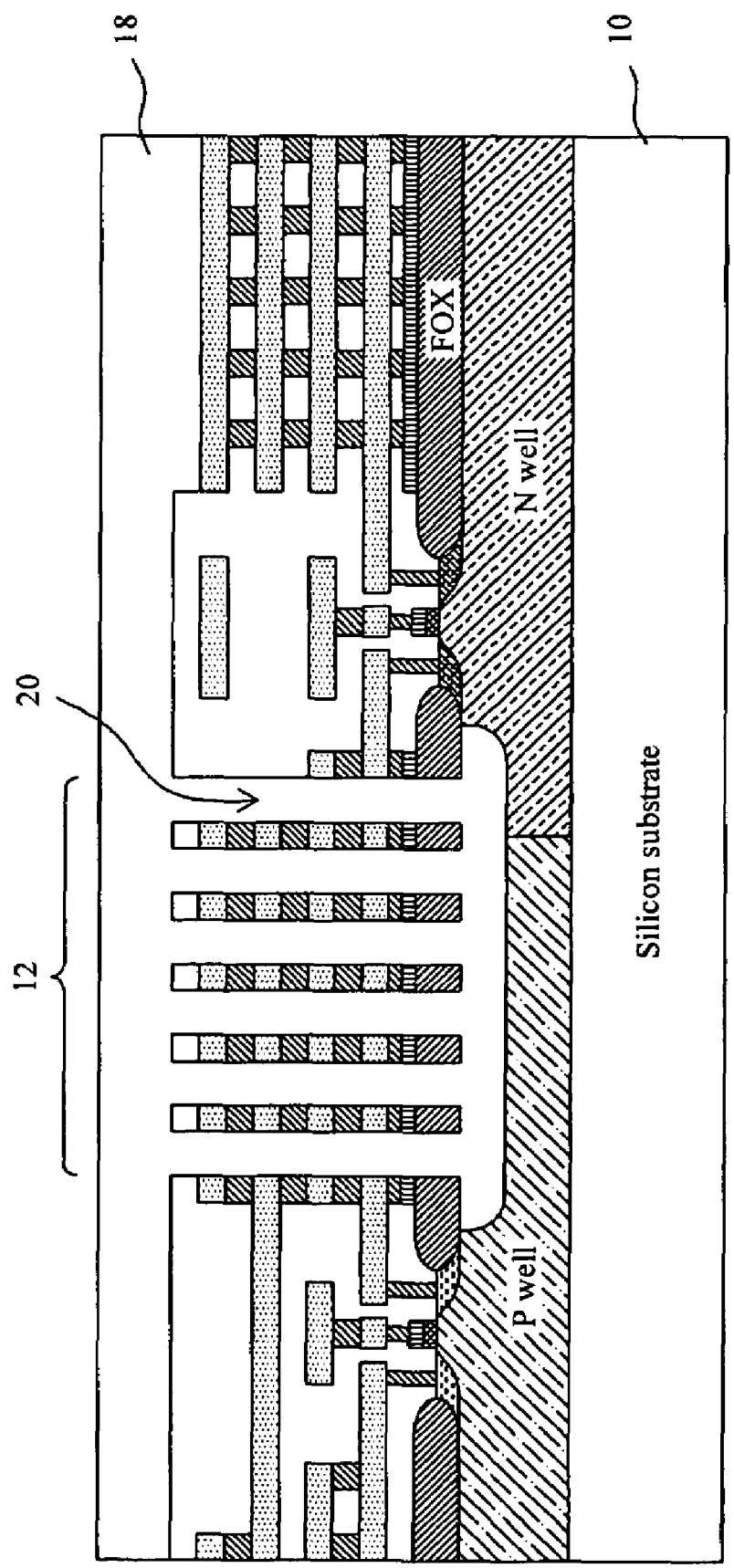
FIG. 2 shows a cross-sectional view of a CMOS-MEMS microstructure available from a multi-project wafer before dicing the wafer in a first embodiment according to the present invention.
Figure 4:
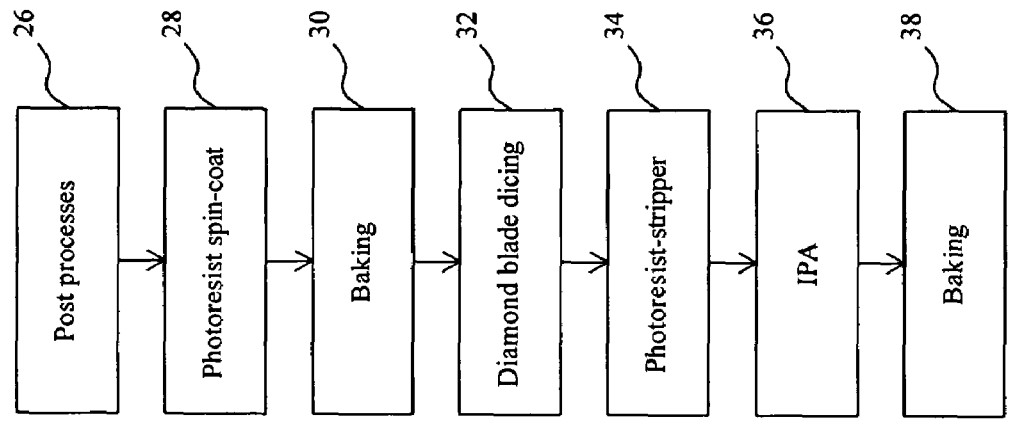
FIG. 4 shows a flowchart of dicing a wafer in the first embodiment according to the present invention.
Figure 3:
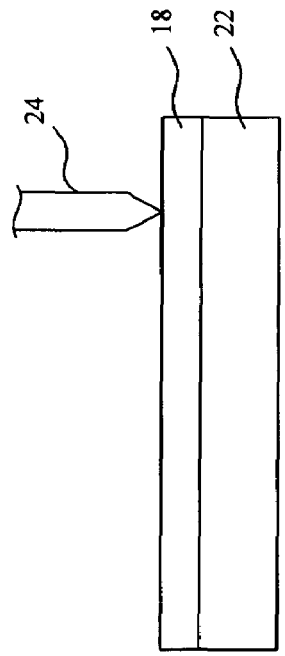
FIG. 3 is an illustrative diagram during dicing a wafer in the first embodiment according to the present invention.

In this method, as shown in FIG. 2, a thick photoresist 18 is used to protect the released microstructure 12, in which the photoresist 18 fills into the gaps 20 in the released microstructure 12 and covers over the released microstructure 12. FIG. 3 is an illustrative diagram when dicing a released CMOS-MEMS multi-project wafer by this method, in which the wafer 22 includes released structures, e.g. the microstructure 12 as shown in FIG. 2, and the photoresist 18 is spun on the full wafer surface to cover all cavities and structures on the wafer 22. The photoresist 18 is used to protect the released structures on the wafer 22 during the dicing process with a diamond blade 24. Further detail steps are illustrated by a flowchart shown in FIG. 4. After the microstructures on the wafer 22 are released by post processes 26, in step 28 the photoresist 18, of about 15 μm for example, is spun on the full wafer surface. Preferably, this photoresist 18 is thick enough to cover all cavities and structures on the wafer 22. One major concern in this method is how to spin the photoresist 18 smoothly. Before the photoresist 18 entirely fills into all the gaps on the wafer 22, the spin-coat velocity is preferably slowed down, for example less than 900 rpm, to avoid the damage due to the centrifugal force. Then, in step 30 the wafer 22 together with the photoresist 18 is baked to fix the photoresist 18, and the baking temperature is so low to avoid the generation of bubbles in the photoresist 18. After that, a diamond blade dicing process 32 is performed to separate dice from the wafer 22, and during this process 32 the microstructures underlying the photoresist 18 will be free from the chipping, vibrations, and damages. After the dicing, the individual die is still covered with the protective photoresist 18 and therefore, additional steps 34 to 38 are performed to clean the residual photoresist 18. An optimized recipe is found for that purpose. In the step 34, the residual photoresist 18 is removed by photoresist-stripper. In this case, the die is dipped in 70° C. photoresist-stripper for one hour. Then, in the step 36, the die is cleaned with 70° C. isopropyl-alcohol (IPA) for five minutes, and following with 90° C. baking for one minute in the step 38 to dry the residual IPA. After the processes, these dice can be fabricated with released structures completely as expected.

<Laser Method>

Figure 5:
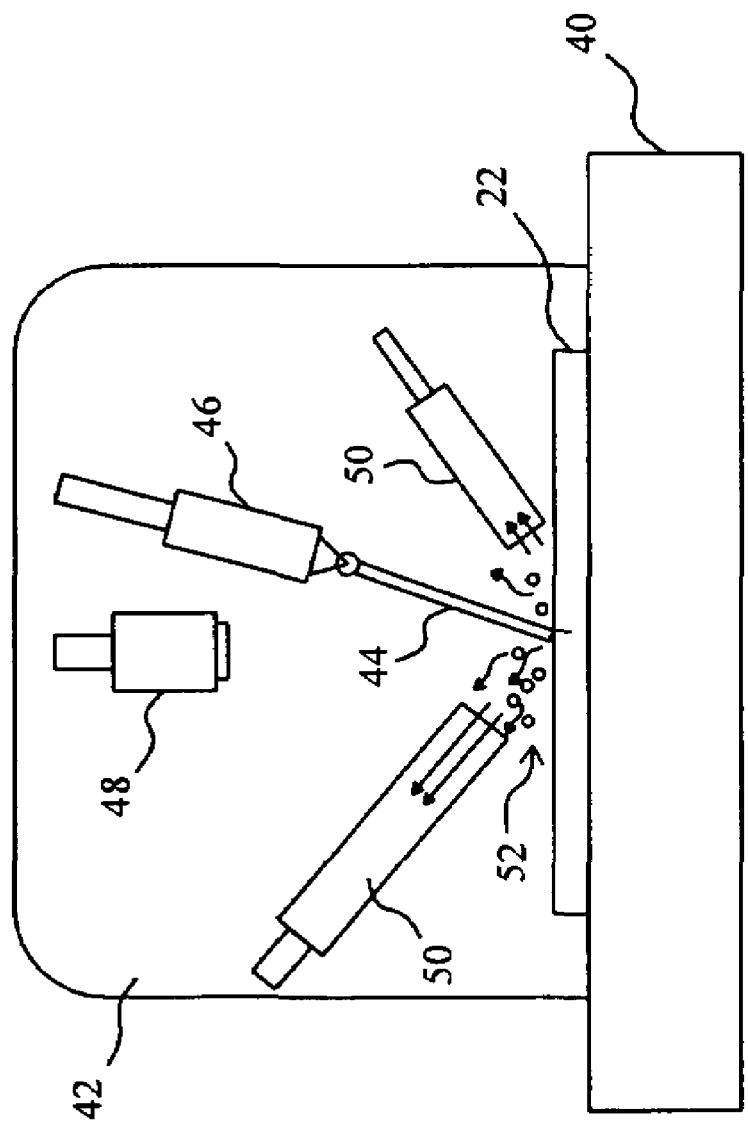
FIG. 5 shows a laser dicing system to scribe a 6 inches multi-project wafer in a second embodiment according to the present invention.
Figure 6:
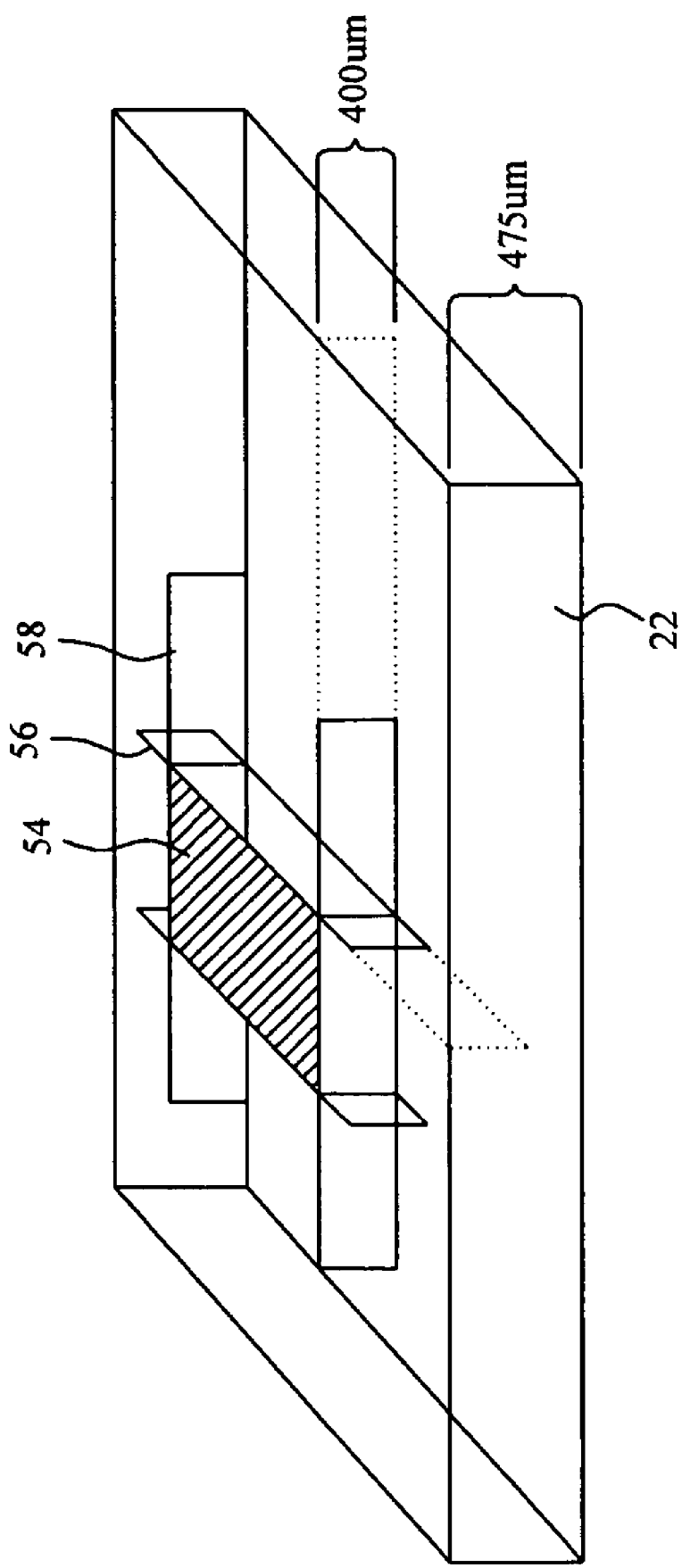
FIG. 6 shows the laser dicing grooves on the front side of the scribed wafer in the second embodiment according to the present invention.
Figure 7:
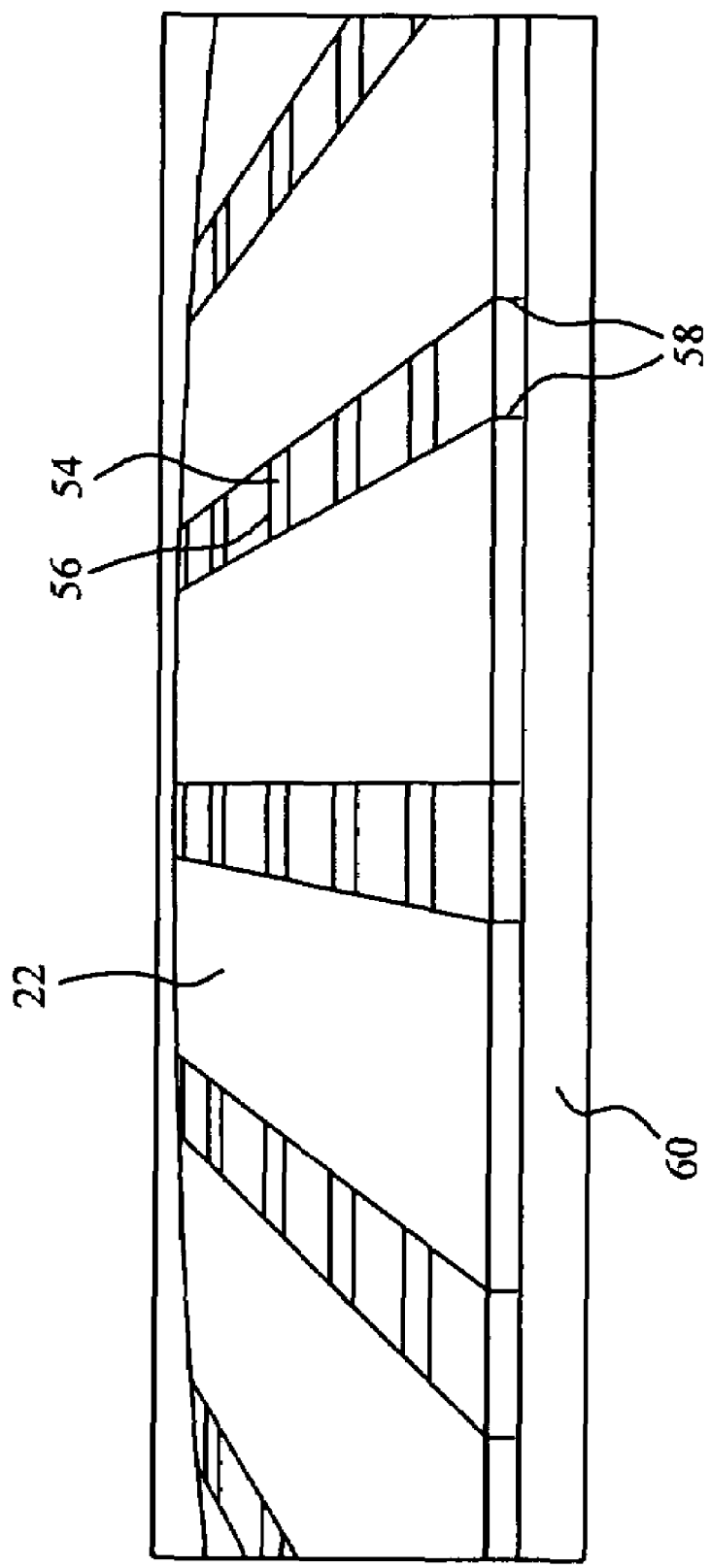
FIG. 7 shows a diagram of a wafer after laser dicing process in the second embodiment according to the present invention.
Figure 8:
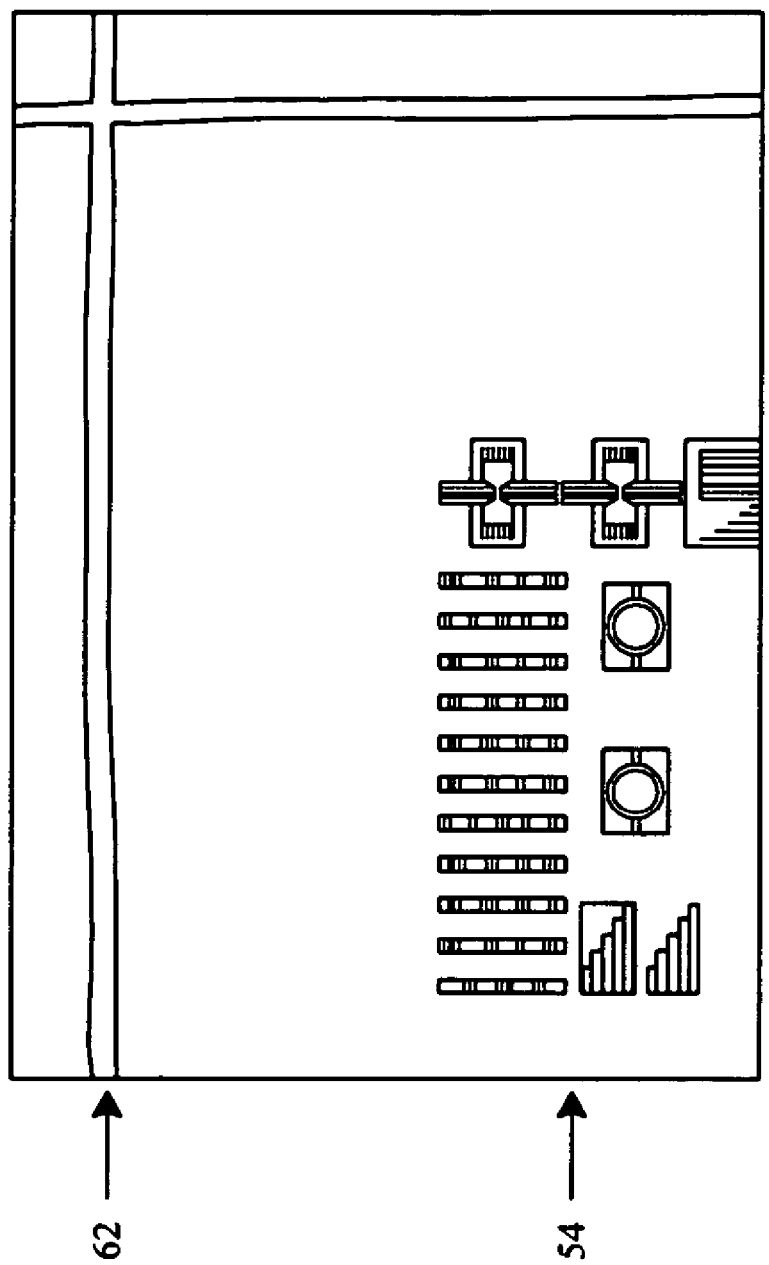
FIG. 8 shows a SEM image of MEMS blocks in the multi-project wafer by laser dicing process in the second embodiment according to the present invention.

As shown in FIG. 5, a UV-radiation Nd: YVO4 laser (355 nm) dicing system is utilized to scribe a 6 inches multi-project wafer 22 that is about 475 μm thick. The wafer 22 is placed on a platform 40, and the dicing process is performed in a vacuum chamber 42. The UV-laser 44 provided by laser source 46 that belongs to ablative process is very unique and offers the best quality. By shortening the laser pulse durations and subsequent increasing in beam intensity, the beam 44 can be reduced in size. Therefore, the power can be up to a specific energy density, e.g. 0.152 mJ/cm$^2$, and high enough to ablate the material being processed. With the UV-laser 44, higher energy density leads to more efficient ablation, the heat affected zone (HAZ) can be minimized, the microcracking is less, and the geometry stability is also better. A charge-coupling device (CCD) 48 is used to monitor the laser dicing. Furthermore, none additional mechanism is required to offer the cooling configuration during the dicing. In this system, two tube pumps 50 are used to sweep those chipping and dust 52 outside the chamber 42 during the dicing process. By precisely controlling the laser energy density, pulse duration, platform moving-track and velocity (e.g. slower than 0.5 m/s), the system can deliver a high dicing throughput and a high yield. In conventional diamond blade dicing process, the blade always saws the full wafer in a straight line and this makes some chips to be sacrificed in the process. Whereas, in this laser process, the dicing path can be programmed to any required shape and region, even it is not straight. As shown in FIG. 6, the laser does not directly cut off MEMS dice 54 from the wafer 22 at a time but scribe to a deep depth, as indicated by the laser dicing grooves 56 and 58 of about 350 to 400 μm deep for example, on the front side of the wafer 22. Then, it will be easy to break along the dicing track from the back with the deeply precutting grooves 56 and 58 at the front side of the wafer 22. In addition, to enhance the process reliability, as shown in FIG. 7, the wafer backside will be mounted on a blue tape 60 at the beginning of the process. The blue tape 60 using to fix those separated dice can also hold some chipping from the backside. The other advantage of the UV-laser dicing is that, there is no serious pollution source or harmful process to contact with the free structures on the wafer 22. FIG. 8 shows a SEM image of the MEMS blocks 54 in the multi-project wafer 22, which have been diced by the laser process. In this picture, the dicing street 62 was intentionally far away the chip region for observing the chipping affection.

Figure 10:
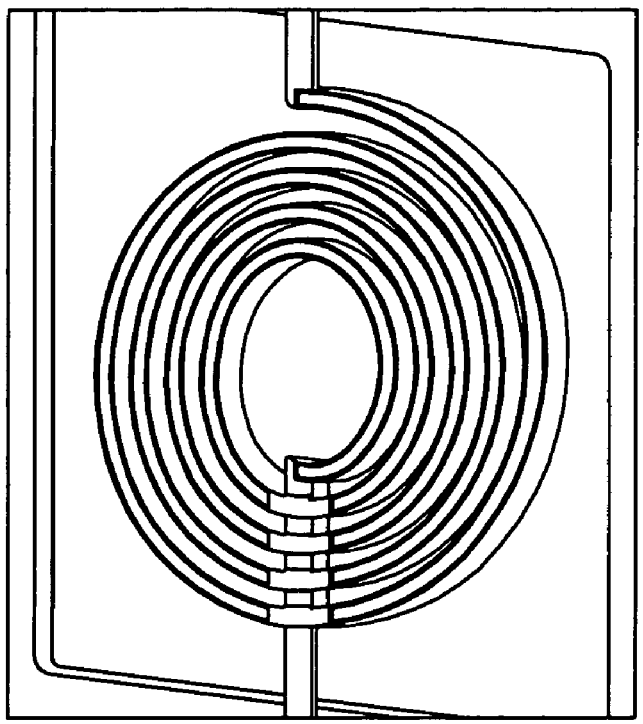
FIG. 10 shows a SEM image of a released micromachined inductor by laser method of the present invention.
Figure 9:
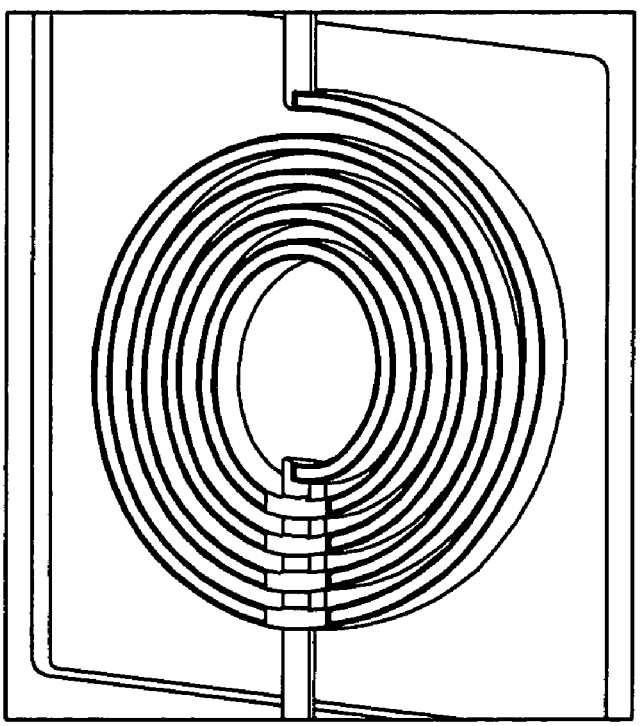
FIG. 9 shows a SEM image of a released micromachined inductor by photoresist method of the present invention.
Figure 12:
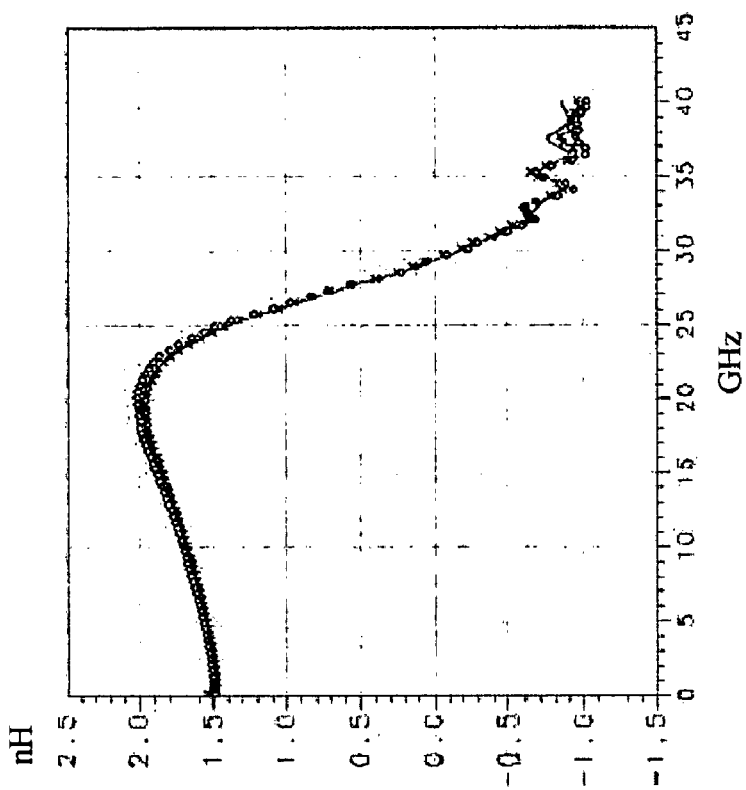
FIG. 12 shows the measured inductance value vs. frequency.
Figure 11:
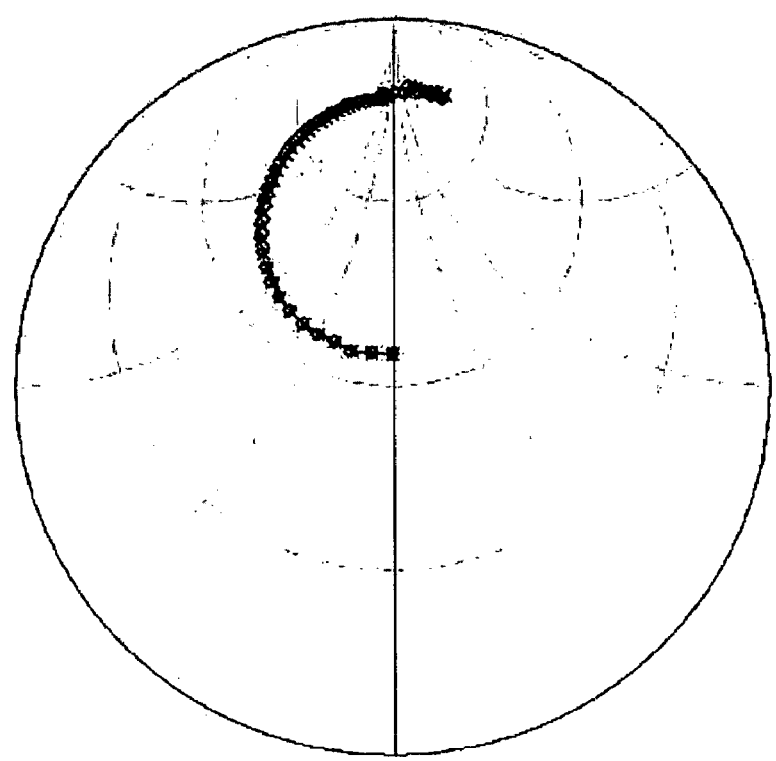
FIG. 11 shows a measured S11 in Smith chart.

Two scanning electron microscope (SEM) images of the released micromachined inductor by the above two methods are shown in FIGS. 9 and 10. Both methods are able to protect the released structures during the dicing process. For this reason, the wafers are free from the damage and the dust. To verify the affection in the process, the inductor $S_{11}$ parameters (see FIG. 11), inductance values (see FIG. 12) of these two methods and initial multi-project wafer without dicing are measured using an Agilent 8510C network analyzer from 0.1 GHz to 40.1 GHz. From the measured results, it is observed that the characteristics of the inductor do not vary obviously, and consequently the $S_{11}$ curves in Smith chart are almost overlapping even in a wideband frequency range. Some microfabrication issues, such as photoresist backing, laser photo-ablative causing heat affection, dicing chipping sputtering, etc. are insensitive to the inductor performance as well. Compared with previous operation and applications, photoresist method may be suitable for experimental or academic level because the total process is rather simple and inexpensive. Almost each lithographic laboratory can handle that photoresist and return the original free structures by the organic solvent. However, users need to clean each die separately, and thus causes a low throughput. Apparently, it will be hard to archive batch processing automatically. Fortunately, it is just opposite to the laser method. By programmable control in platform moving path, the laser configuration will get a stably high throughput and will be suitable for the commercial integrated dicing efficiently. The comparison in these two methods is summarized in Table 1.

TABLE 1

|  | Photoresist method | Laser method |
| --- | --- | --- |
| Cost | Low<br>(Solvent) | Low<br>(Laser source) |
| Process | Easy | Easy |
| Throughput | Low<br>(Individual release) | High<br>(Programmable) |
| Reliability | Medium<br>(Depends on design structures) | High |

Figure 13:
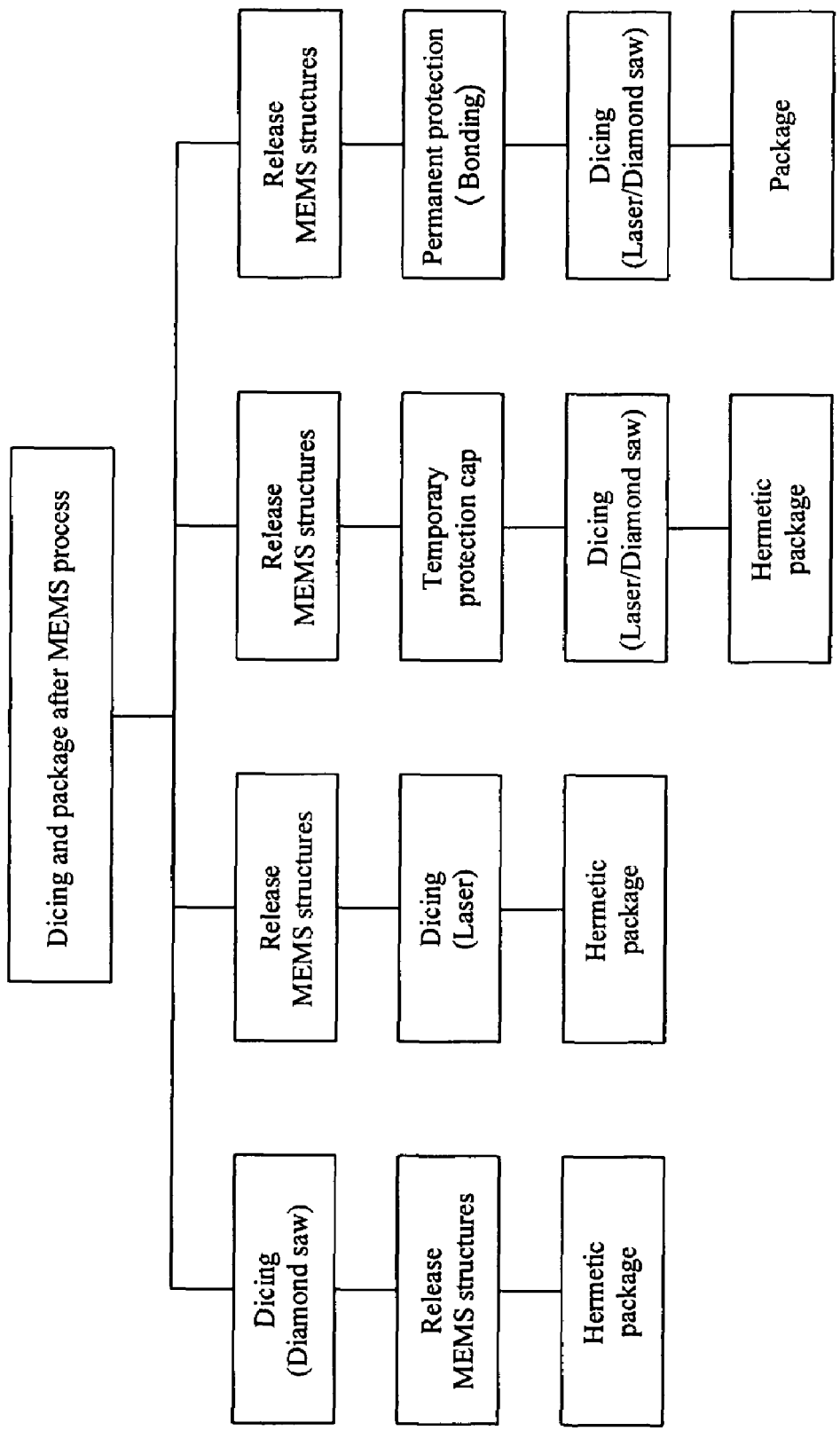
FIG. 13 summarizes several methods with different procedures to achieve the wafer dicing and package.

FIG. 13 summarizes several methods with different procedures to achieve the wafer dicing and package. The sequences of dicing and package are mostly decided by the micromachined designs and applications.

MEMS technologies offer exciting possibilities to improve the performance and multifunction capability to conventional CMOS circuits. The challenges to protect the moveable microstructures in a CMOS-MEMS multi-project wafer during the dicing process are presented hereof. The advantages of methods according to the present invention include the simplicity and few processing steps, and there are no inherent limitations such as size and thickness of the wafer. For the future work, other laser dicing molds and procedures will still be studied in order to further improve the process automation and sticking mechanism.

While the present invention has been described in conjunction with preferred embodiments thereof, it is evident that many alternatives, modifications and variations will be apparent to those skilled in the art. Accordingly, it is intended to embrace all such alternatives, modifications and variations that fall within the spirit and scope thereof as set forth in the appended claims.

What is claimed is:

1. A method for dicing a released CMOS-MEMS multi-project wafer, comprising the steps of:
    spinning on a photoresist over the wafer surface for covering a released microstructure on the wafer;
    reducing a spin velocity to less than 900 rpm prior to the photoresist entirely filling all gaps in the wafer surface for maintaining a constant, non-zero centrifugal force on the photoresist to smoothly fill the gaps,
    dicing the wafer,
    removing the photoresist after dicing the wafer, and
    applying an isopropyl-alcohol after the photoresist is removed from the released microstructure.

2. The method of claim 1, further comprising a baking step after the photoresist is spun on the wafer surface.

3. The method of claim 1, wherein the step of removing the photoresist comprises using a photoresist-stripper.

4. The method of claim 1, further comprising a baking step after applying the isopropyl-alcohol.

5. A method for dicing a released CMOS-MEMS multi-project wafer, comprising the steps of:
    placing the wafer on a platform and in a vacuum chamber; and
    dicing the wafer with a UV-laser having an energy density greater than or equal to $0.152$ $mJ/cm^2$ in combination with a selective pulse duration to provide a predetermined throughput, wherein the step of dicing further comprises scribing to a deep depth into the wafer such that a diced portion of the wafer is incompletely separated from the rest of the wafer, and breaking the diced portion of the wafer from a back of the rest of the wafer with grooves at a front side of the wafer.

6. The method of claim 5, further comprising sweeping chipping and dust outside the vacuum chamber with a tube pump during dicing the wafer.

7. The method of claim 5, further comprising attaching a blue tape on a backside of the wafer before dicing the wafer.

8. The method of claim 5, further comprising forming a dicing path by controlling the platform to move during dicing the wafer.

9. The method of claim 8, wherein the platform is moved with a velocity slower than 0.5 m/s.

* * * * *